United States Patent [19]

Gray

[11] 4,142,161

[45] Feb. 27, 1979

[54] CRYSTAL OSCILLATOR

[75] Inventor: John W. Gray, Guilford, Conn.

[73] Assignee: Timex Corporation, Waterbury, Conn.

[21] Appl. No.: 878,218

[22] Filed: Feb. 16, 1978

[51] Int. Cl.$^2$ .............................................. H03B 5/36
[52] U.S. Cl. .............................. 331/116 R; 58/23 AC; 310/370
[58] Field of Search ........................ 331/116 R; 58/23

[56] References Cited

U.S. PATENT DOCUMENTS

| | | | |
|---|---|---|---|
| 3,676,801 | 7/1972 | Musa | 331/116 R |
| 3,683,213 | 8/1972 | Staudte | 331/116 R |
| 3,889,211 | 6/1975 | Morozumi | 331/116 R |
| 3,996,530 | 12/1976 | Feistel et al. | 331/116 R |
| 4,065,728 | 12/1977 | Saari | 331/116 R |

Primary Examiner—John Kominski
Attorney, Agent, or Firm—Lawrence Hager

[57] ABSTRACT

A crystal-controlled oscillator of integrated circuit design, comprising, a three-stage direct-coupled amplifier employing insulated gate field-effect-transistors and overall resistive negative (DC) feedback for bias stabilization thereof. The oscillator is designed to operate at a frequency at which the reactive network, including the inherent interelectrode capacitances of the field-effect-transistors, of the amplifier results in a loop phase shift which satisfies the Barkhausen Criterion.

5 Claims, 6 Drawing Figures

CRYSTAL OSCILLATOR

BACKGROUND OF THE INVENTION

This invention relates generally to an improved piezoelectric crystal oscillator circuit for use in an electronic timepiece. It is particularly directed to the provision of a tuning fork quartz crystal oscillator which maintains frequency stability during variations in the supply voltage.

Recently, watches have been developed which utilize quartz crystal vibrators to provide a high frequency time standard signal.

The application of this type of oscillator circuit to timekeeping, particularly in wristwatches, imposes a number of conditions upon the design of the oscillator circuit, VIZ:

it must have a very low power consumption, it must be capable of operating from a very low voltage supply, it must sustain oscillation during temporary, but substantial, supply voltage drops caused, for example, during display illumination/actuation, it must maintain high frequency stability with supply voltage decreases during the life of the battery, and the crystal vibrator must be inexpensive.

Some known embodiments of crystal-controlled oscillators which utilize crystal vibrators/resonators that are practically priced for use in wristwatches comprise tuning fork type vibrators across the terminals of an amplifier of integrated circuit design. As seen from the prior art, however, the operation of this kind of crystal device in heretofore known oscillator/amplifier wristwatch circuits gives rise in particular to such loop phase conditions and circuit limitations/constraints which result in inefficient crystal operation, i.e., at its anti-resonant frequency characteristic, and therefore, necessitated the use of a relatively high voltage/current supply source. The result, especially where application involves wristwatch circuits supplied by generally available button-type wristwatch batteries whose output voltage decreases progressively during their operation, is that the time of utilization of these batteries is reduced to that period of their operation in which the voltage level is sufficient to maintain the precise loop phase conditions and also typically necessitated the use of more than one such battery to provide the required voltage/current needs of the oscillator to sustain divider or counter circuit actuation, particularly during display illumination/actuation.

The prior art includes a number of crystal oscillator circuits such as is described in U.S. Pat. No. 3,935,546, issued Jan. 27, 1976 to Shinji Morozumi et al., U.S. Pat. No. 3,824,495, issued July 16, 1974 to Erich Gerum, U.S. Pat. No. 2,946,018, issued July 19, 1960 to S. K. Benjamin et al., U.S. Pat. No. 3,911,378, issued Oct. 7, 1975 to James E. Buchanan and U.S. Pat. No. 3,761,840 issued Sept. 25, 1973 to Gordon F. Bremer.

In contrast with the prior art, the present invention provides an improved crystal oscillator circuit, particularly an oscillator circuit which utilizes a three terminal tuning fork type crystal vibrator, which satisfies the above noted conditions, utilizes an integrated circuit amplifier to provide both regenerative feedback and self bias stabilization, operates the crystal vibrator substantially at its peak efficiency, reduces oscillator voltage/current level requirements, prolongs the useful life of the voltage/current source and/or enables practical use of a single button-type wristwatch battery.

SUMMARY OF THE INVENTION

Essentially, and in accordance with the invention, the crystal is operated at its series resonant frequency and is coupled with an amplifier circuit means which in addition to establishing a regenerative feedback loop for the series resonant frequency signal also provide (DC) feedback voltage for self bias stabilization to substantially maintain the precise phase shift through the amplifier for any practical value of the supply voltage.

It is an object of the present invention, therefore, to provide a highly stable oscillator.

It is a further object of the present invention to provide a highly stable oscillator for electronic timepieces which employs an inexpensive crystal with high precision and low voltage and current input.

It is another object of this invenion to provide an improved crystal oscillator circuit wherein changes in the supply voltage have a minimum effect on the frequency characteristic thereof.

It is still another object of this invention to provide a crystal oscillator circuit wherein the interelectrode capacitances of the metal-oxide semiconductor field-effect-transistors (hereinafter indicated by the initials MOS-FET) comprising the amplifier are utilized to provide the desired phase shift through the amplifier for regenerative (positive) feedback of the oscillatory signal.

It is another object of the present invention to provide an improved series resonant crystal oscillator circuit which employs bias feedback for self-stabilization of the crystal oscillator circuit.

It is another object of the present invention to provide a crystal oscillator circuit which substantially reduces the input current requirement, and therefore improves battery life, to sustain proper actuation of the counting/divider circuits during display illumination or actuation.

It is still a further object of the present invention to provide an improved tuning fork crystal oscillator circuit for use in an electronic watch which is operated substantially at the series resonant frequency of the crystal.

It is another object of the invention to provide an oscillator circuit for a tuning fork type crystal vibrator which requires a lower (battery) voltage source while sustaining high precision and voltage output to succeeding divider/counter stages during display actuation.

It is another object of the present invention to provide a MOS-FET amplifier/oscillator circuit having an odd number of amplifier stages such that a negative DC feedback is available from a stage thereof which is utilized for self-stabilization of the amplifier/oscillator circuit, the interelectrode capacitances at the series resonant frequency of the crystal vibrator results in an oscillatory signal phase shift through the amplifier to provide regenerative feedback and the oscillatory signal loop gain is sufficient to drive a relatively high impedance crystal vibrator such as a tuning fork crystal vibrator.

Further advantages and objectives of the present invention will be apparent from the following detailed description of the preferred embodiment of the invention. Like numerals refer to like devices/functions throughout.

DETAILED DESCRIPTION OF THE INVENTION

The following is a detailed description of the best presently contemplated modes of carrying out the invention. This description is not to be taken in a limiting sense but is made merely for the purpose of illustrating the general principles of the invention since the scope of the invention is best defined by the appended claims.

Figure 1:
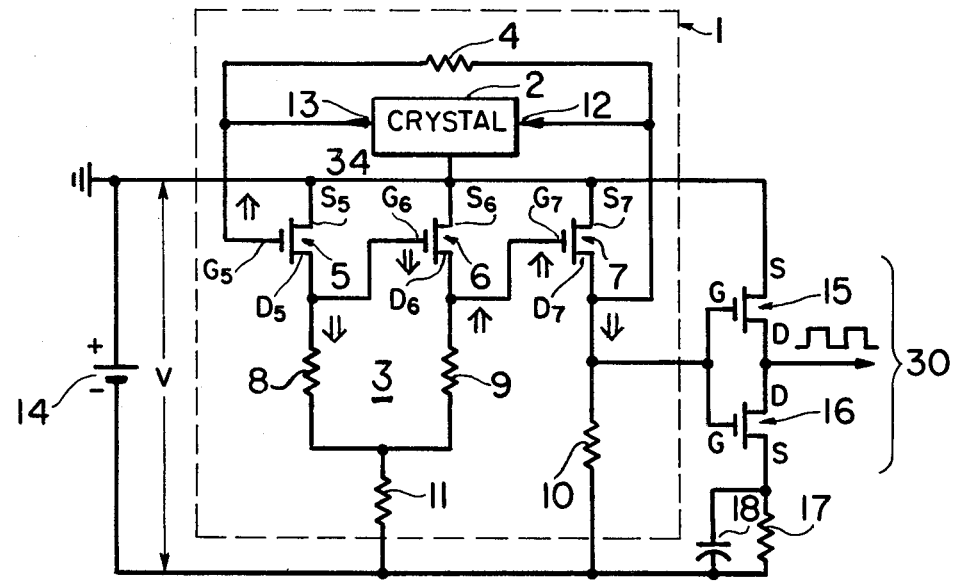
FIG. 1 is a schematic diagram of the crystal oscillator circuit according to the invention.

Referring now to FIG. 1, the oscillator circuit 1 (shown within phantom outline) comprises a (quartz) crystal 2, a three-stage MOS-FET amplifier 3 and feedback resistor 4.

The quartz crystal 2 is of the three terminal tuning fork type vibrator/resonator which are known in the prior art. Examplary of the prior art tuning fork oscillator field are U.S. Pat. No. 3,946,257 issued Mar. 23, 1976 to Yasukazu Kawamura, U.S. Pat. No. 3,683,213, issued Aug. 8, 1972 to Juergen H. Staudte and U.S. Pat. No. 3,766,616 issued Oct. 23, 1973 to Juergen H. Staudte.

The amplifier 3 includes three insulated gate field-effect transistors (FET's) 5, 6 and 7, and resistors 4, and 8 through 11 forming a three-stage direct-coupled amplifier with DC negative feedback.

The crystal 2 is connected between the gate $G_5$ of transistor 5 and the drain $D_7$ of transistor 7. The drain $D_5$ of transistor 5 is connected to the gate $G_6$ of transistor 6. The drain $D_6$ of transistor 6 is connected to the gate $G_7$ of transistor 7. The drain $D_7$ of transistor 7 is connected to input terminal 12 of crystal 2. Resistor 4 is connected across terminals 12, 13 of crystal 2 and from the drain $D_7$ to the gate $G_5$ of transistors 7 and 5 respectively. The positive terminal of battery 14 is connected to the source electrodes $S_5$, $S_6$ and $S_7$. The negative terminal of battery 14 is connected to one end of resistors 10 and 11. The other end of resistor 11 is coupled via resistors 8 and 9 to the drains $D_5$ and $D_6$ respectively. The other end of resistor 10 is coupled to the drain $D_7$.

Figure 6:
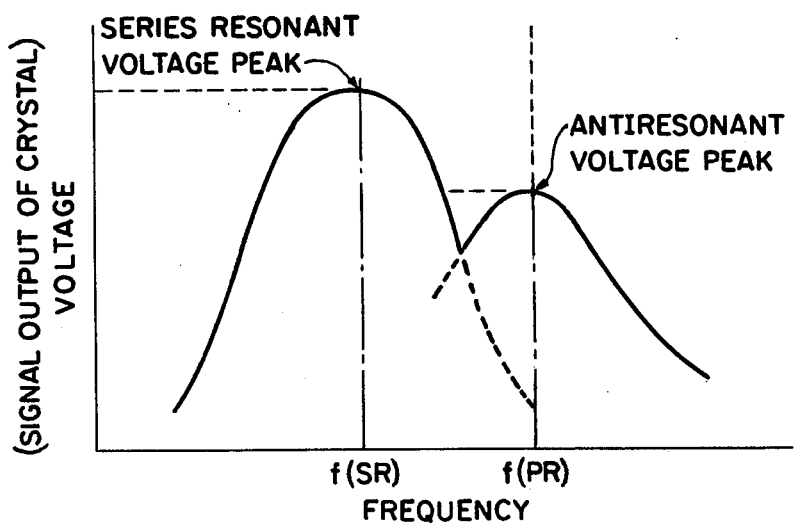
FIG. 6 is a graph illustrating the output signal voltage response for a given input signal voltage level characteristic with frequency of the crystal below, at and above the natural series resonant frequency of the crystal vibrator.

In operation, with reference to FIGS. 1 and 6, the direct-coupled amplifier 3 which comprises three P-channel FET's 5, 6 and 7, provides a direct voltage/current (DC) gain having the negative sense, i.e., since each FET 5, 6 and 7 inverts the DC signal by approximately 180°, with an increase in the DC bias voltage at the gate $G_5$ of transistor 5 the output DC voltage at the drain $D_7$ of transistor 7 is caused to decrease by a proportional amount and vice versa. This relationship is illustrated by the double-shaft arrows ↑,↓ which indicates the amplifier circuit response, at each gate and drain electrode, to, for example, an increased DC bias at gate $G_5$.

Resistor 4 provides a feedback path for the compensating DC voltage at the drain $D_7$ of transistor 7 which results in self-stabilization of all the gate and drain bias levels of amplifier 3 and, thereby, maintains the phase shift through the amplifier substantially constant with respect to the oscillatory signal.

At the operating frequency of the oscillator 1, i.e., approximately 32 KHz, the inherent interelectrode capacitances of the gates and drains of FET's 5, 6 and 7 together with resistors 8 through 11 of amplifier 3, result in an oscillatory signal phase lag at each FET 5, 6 and 7 amplifier stage of approximately 60°. Therefore, since three FET amplifier stages 5, 6 and 7 are utilized, and since each FET amplifier provides an inherent inversion of 180° phase shift to the oscillatory signal, the overall amplifier oscillatory signal phase shift, from the amplifier input at gate $G_5$ to its output at drain $D_7$, is approximately 720° which results in a substantially (positive) regenerative feedback signal to the input terminal 12 of crystal 2.

Thus, as noted above, the oscillatory signal is phase shifted by approximately 180° by each FET amplifier stage, which is referred to herein as the FET's inherent (oscillatory signal) phase shift or inversion properties, with each FET, for example, being operated substantially as a class A amplifier. And due to the FET interelectrode capacitances and associated circuit resistance, each FET amplifier stage effects a 180° + 60° phase shift per FET amplifier stage.

Since the crystal 2 is connected between the input $G_5$ and output $D_7$ terminals of the amplifier 3 for establishing a series feedback loop, the oscillator 1 will maintain an oscillatory sinusoidal signal voltage if the signal gain around the feedback loop is greater than unity. With the three stage amplifier 3 this unity gain requirement is easily achieved.

And since the input 12 and output 13 terminals of the crystal 2 are conductively isolated from each other, i.e., in effect capacitive, they do not affect the DC negative feedback. Resistor 4 can be made very high since the gate $G_5$ does not draw current, and this will ensure that it will not interfere with the crystal 2 operation.

As noted above, tuning fork crystal vibrators were conventionally operated in an oscillator circuit at its anti-resonant frequency f(PA). In this operating condition, however, there is substantial loss in efficiency, i.e., the crystal is not being operated at its peak (signal output) voltage vs. frequency characteristic for a given signal input voltage (see FIG. 6), due to internal crystal oscillatory energy losses. This inefficiency necessitated the use of higher supply voltage/current, generally being satisfied in the wristwatch art field by the use of at least two batteries, typically each being approximately a 1.6 volt energy cell.

Figure 5:
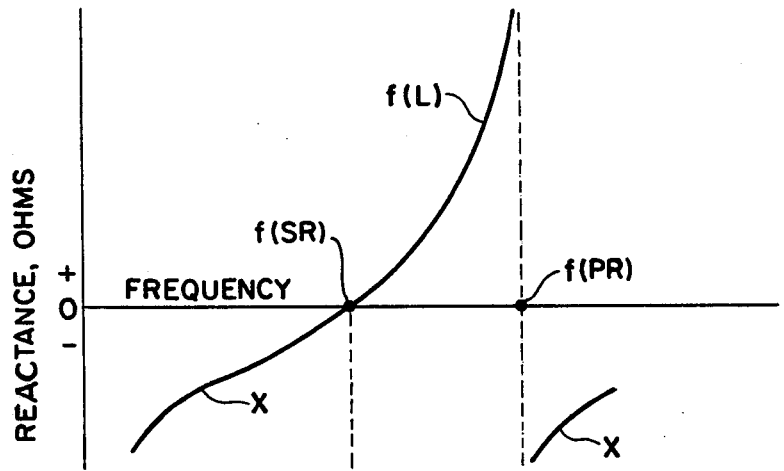
FIG. 5 shows the characteristic vibration of the reactance of a piezoelectric crystal with frequency.

The general description of the operation of oscillator 1 depends on the characteristic variation of the reactance of the quartz crystal 2 with frequency. Two curves, not to scale, showing this variation is depicted in FIGS. 5 and 6. The reactance X exhibited by a crystal is shown, passing through zero at the series resonance frequency f(SR) and increasing inductively at a frequency f(L) to a very high value.

At the series resonant frequency f(SR), the inductive and capacitive reactances substantially cancel each other and, therefore, the crystal exhibits its maximum transconductance of the input-to-output signal voltage or peak efficiency as illustrated by the output peak voltage at the series resonant frequency of the crystal. It can readily be seen from FIGS. 5 and 6 that as the frequency is increased above the series resonant frequency, the output voltage decreases until anti-resonance occurs. The peak voltage output vs. frequency, for the same level of input voltage signal as used at the series resonant frequency f(SR), is substantially less at the anti-resonant frequency f(PR).

In accordance with the present invention, the oscillator 1 comprises a tuning fork crystal vibrator operated at its series resonant frequency in series circuit with an amplifier which in addition to providing regenerative feedback to the crystal 2 also provides, via a feedback circuit, self-stabilization DC feedback for oscillator stability. In this manner, the desired phase shift through the amplifier is maintained and, therefore, the crystal 2 can be operated substantially at its series resonant frequency.

Transistors 15 and 16 are employed as a complementary amplifier-driver 30. Resistor 17 is utilized to reduce the current requirement. Capacitor 18 improves the shape of the output waveform, making it substantially a square wave.

While a wide variety of types of crystals, transistors and associated elements may be employed, the oscillator circuit 1 embodiment illustrated in FIG. 1 was constructed and successfully operated using the following components:

| Voltage source 14 1.6 volt battery Transistors | Resistors | Ohms |
| --- | --- | --- |
| 5, 6 and 7 RCA TA 6178 W | 8 | 330 K |
|  | 9 | 47 K |
| Capacitor 18 100 pf | 11 | 680 K |
| Crystal 2 Statek TN-7 | 10 | 680 K |
|  | 17 | 220 K |

Figure 2:
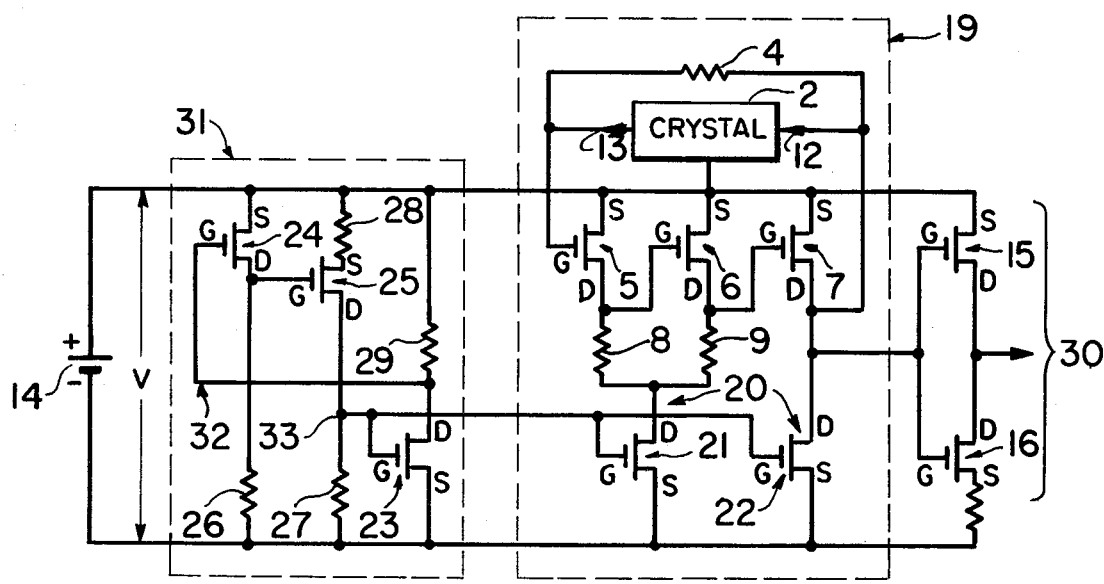
FIG. 2 is a schematic diagram of an alternative embodiment of the invention.

Referring now to FIG. 2, a schematic circuit diagram of an alternative embodiment of the present invention is shown. The embodiment of the invention is similar to the oscillator 1 circuit shown in FIG. 1 with the exception that resistors 10 and 11 are replaced with a constant current device 20 comprising FET's 21 and 22. The constant current device 20 is utilized to further reduce the current input requirement of the circuit to sustain oscillations and actuation of the divider and/or counter circuits during display illumination/actuation and also results in improved oscillator stability.

To achieve constant current, the gates of FET's 21 and 22 are controlled by a circuit employing N-channel FET 23 and P-channel FET's 24 and 25. These three devices 23, 24, 25 are connected as a three-stage direct-coupled amplifier 31 (shown within phantom outline) with overall negative feedback, via feedback circuit 32. Resistors 26, 27 and 28 are selected to have extremely high resistance values so as to draw very little current from the battery 14.

Amplifier 31 and constant current device 20, which utilize the characteristics of integrated circuit MOSFET technology, i.e., (1) that similar devices 21, 22, 23 in the same integrated circuit will have substantially equal characteristics, (2) the drain current of a FET is practically independent of drain voltage for a given gate potential, and (3) the gate-to-source potential required for a given drain current is relatively independent of the battery voltage V, are desiged to maintain the drain currents of FET's 21, 22 and 23 substantially constant for any practical battery voltage V. This is achieved by connecting the gates of FET's 21, 22 and 23 to a common voltage potential at circuit point 33. The voltage potential at circuit point 33 is dependent on the drain current of FET 25. The drain current of FET 25 is controlled by the voltage potential at the drain of FET 24. The current and voltage potential at the drain of FET 24 are controlled/varied by the voltage potential at the gate of FET 24 which is controlled by the feedback circuit 32. If the battery voltage V varies, the voltage at the drain of FET 23 will tend to also vary. However, this voltage change is coupled, via feedback circuit 32, to the gate of FET 24 which causes the drain currents and voltages of FET's 24 and 25 to vary. The circuit parameters are selected such that the voltage at circuit point 33, due to the drain current of FET 25, is caused to vary the gate voltage potentials of FET's 21, 22 and 23 so as to maintain constant current in their drains. As noted above, the current is monitored by the voltage drop across resistor 29 by the feedback circuit 32 so as to maintain constant current through FET 23. Since FET's 21, 22 and 23 are similar devices, the current through FET's 21 and 22 will be maintained substantially equal and constant with the current through FET 23.

Figure 3:
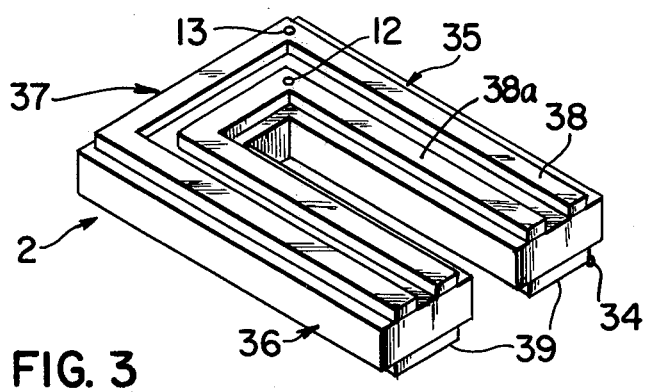
FIG. 3 is a perspective plan view of a tuning fork vibrator.
Figure 4:
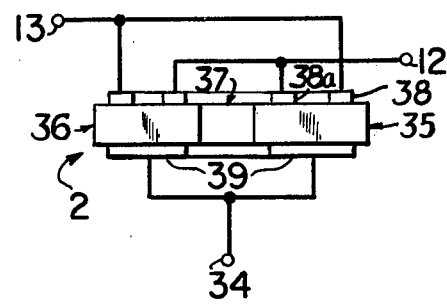
FIG. 4 shows the connection of electrodes which are made on the three terminal tuning fork vibrator.

Referring now to FIGS. 3 and 4, there are shown a tuning fork crystal vibrator 2 in accordance with the preferred embodiment of the invention. The crystal vibrator 2 typically may be fabricated of quartz, although any other piezoelectric or ferroelectric material may be used. As evident in FIGS. 3 and 4, crystal vibrator 2 includes a pair of tines 35, 36, extending from the tuning fork stem 37. Disposed on each tine 35, 36 are electrodes 38, 38a. Disposed on the bottom or reverse surface of the crystal vibrator 2 is an electrode 39 extending substantially across both tines 37, 38.

Tuning fork crystal vibrator 2 may be excited by applying an electric field across appropriate electrodes.

In accordance with the preferred embodiment of the invention, the reverse surface electrode 39 is grounded, i.e., coupled to the common reference (positive) potential of the battery, and crystal 2 is operated as a three terminal device. In this instance, the input oscillatory signal is applied between the crystal grounded terminal 34 and input terminal 12, and the output signal is derived between terminal 34 and output terminal 13. The output signal will be in phase with the input.

While there has been described herein what is considered to be the preferred embodiments of the invention, other modifications may occur to those skilled in the art, and it is intended that the appended claims to cover all such modifications as fall within the true spirit and scope of the invention.

What is claimed is:

1. A crystal oscillator circuit energized by a supply voltage source comprising:
   a tuning fork crystal vibrator means for providing an oscillatory signal at a series resonant frequency of said vibratory means; and
   circuit means coupled to said crystal vibrator means comprising a direct-coupled amplifier having at least three FET stages for affording an inherent phase shift to the oscillatory signal at each FET stage and an additional predetermined phase shift to the oscillatory signal resulting from the interelectrode capacitance of each FET stage and resistance means for providing a regenerative feedback signal to said crystal vibrator means and for providing a DC bias stabilization feedback potential to a gate terminal of each FET stage for maintaining the oscillatory signal loop phase shift substantially constant with supply voltage variations.

2. A crystal oscillator circuit as in claim 1, wherein the circuit means comprises a three-stage direct-coupled amplifier having a first, second and third FET stage of a first conductivity type channel, the drain terminal of the first FET is connected to the gate terminal of the second FET, the drain terminal of the second FET is connected to the gate terminal of the third FET, the drain terminal of the third FET is connected to a first terminal of the crystal vibrator and to one end of a bias feedback resistor, the other end of which is connected to the gate terminal of the first FET and to a second terminal of the crystal vibrator, the source terminals of said first, second and third FET's being coupled to a first terminal of the supply voltage source and the drain terminals of said FET's being coupled through respective first, second and third resistors to a second terminal of said supply voltage source.

3. A crystal oscillator circuit as in claim 1, wherein:
the inherent phase shift of 180° and a predetermined phase shift of 60° for each FET stage provides a 240° phase shift of the oscillatory signal in each FET signal.

4. A crystal oscillator circuit energized by a supply voltage source comprising:
a tuning fork crystal resonator having a first, second and third crystal terminal and being operated approximately at its series frequency for providing an oscillatory signal; and
an amplifier circuit means having a first, second and third FET, the drain terminal of the first FET is connected to the gate terminal of the second FET, the drain terminal of the second FET is connected to the gate terminal of the third FET, the drain terminal of the third FET is connected to the first crystal and to one end of a bias feedback resistor, the other end of said bias feedback resistor being connected to the gate terminal of the first FET and to a second crystal terminal, the source terminals of said first, second and third FET's and third crystal terminal being coupled to a first terminal of the supply voltage source, the drain terminals of said first, second and third FET's being each respectively coupled via a resistance means to a second terminal of the supply voltage source for affording an inherent 180° phase shift to said oscillatory signal at each FET and an additional phase shift to the oscillatory signal of approximately 60° resulting from the interelectrode capacitance of each FET and resistance means to provide a regenerative feedback signal to said crystal resonator and a DC bias stabilization feedback potential from the drain of said third FET via said bias feedback resistor to the gate of said first FET to maintain oscillatory phase shift through said amplifier substantially constant with supply voltage variations.

5. A crystal oscillator circuit in claim 4, wherein said resistive means comprises a constant current source.

* * * * *